United States Patent [19]
Kenney

[11] Patent Number: 5,532,965
[45] Date of Patent: Jul. 2, 1996

[54] MEMORY PRECHARGE SCHEME USING SPARE COLUMN

[76] Inventor: Donald M. Kenney, 18 Birch Rd., Shelburne, Vt. 05482

[21] Appl. No.: 423,922

[22] Filed: Apr. 13, 1995

[51] Int. Cl.[6] ..................... G11C 7/00
[52] U.S. Cl. ............ 365/200; 365/189.05; 371/10.2
[58] Field of Search .............. 365/200, 189.05; 371/10.2, 10.3

[56] References Cited

U.S. PATENT DOCUMENTS

| | | | |
|---|---|---|---|
| 5,231,604 | 7/1993 | Watanabe | 365/189.05 |
| 5,278,793 | 1/1994 | Yeh | 365/200 |
| 5,299,164 | 3/1994 | Takeuchi et al. | 365/200 X |
| 5,383,156 | 1/1995 | Komatsu | 365/200 |

OTHER PUBLICATIONS

Aoki et al., "A 1.5V DRAM for Battery Based Applications", IEEE Journal of Solid State Physics, vol. 24, No. 5, pp. 1206–1212, Oct. 1989.

Kenney, "Low Charge Consumption Memory", U.S. Patent Application Serial No. 08/216,611, filed Mar. 23, 1994.

Fitzgerald et al., "Circuit Implementation of Fusible Redundant Addresses on RAMs for Productivity Enhancement", IBM J. of Res. & Dev., vol. 24, No. 3, pp. 291–298, May 1980.

*Primary Examiner*—David C. Nelms
*Assistant Examiner*—Son Dinh

[57] ABSTRACT

Performance is improved for a memory array composed of storage elements which require a preconditioning operation prior to writing new data or rewriting old data. At least one spare column of memory elements is provided. The spare column is preconditioned during a time when it is not used for data storage. During a write operation to a memory address, data are written into the preconditioned spare column instead of the column associated with the memory address. The memory address is reassociated with the spare column, and the column with which it was previously associated becomes a new spare column which is preconditioned during restore and made ready for use during a subsequent memory access. In this way time for the preconditioning operation is hidden, and no delay for preconditioning is incurred. A plurality of spare columns allows each spare column to be preconditioned during a plurality of memory cycles.

16 Claims, 8 Drawing Sheets

FIG. 6

| ADDRESS | INITIAL | CYCLE 1 | CYCLE 2 | CYCLE 3 | CYCLE 4 |
|---|---|---|---|---|---|
| 001 | 001 | 001 | 003 | 003 | 003 |
| 002 | 002 | 002 | 002 | 002 | 002 |
| 003 | 003 | 129 | 129 | 129 | 127 |
| 004 | 004 | 004 | 004 | 004 | 004 |
| * | * | * | * | * | * |
| * | * | * | * | * | * |
| * | * | * | * | * | * |
| etc. | etc. | etc. | etc. | etc. | etc. |
| * | * | * | * | * | * |
| * | * | * | * | * | * |
| 127 | 127 | 127 | 127 | 001 | 001 |
| 128 | 128 | 128 | 128 | 128 | 128 |
| Spare Address | 129 | 003 | 001 | 127 | 129 |

MEMORY PRECHARGE SCHEME USING SPARE COLUMN

FIELD OF INVENTION

This invention relates to a memory array in which the storage elements require a preconditioning operation prior to each data write or rewrite operation.

BACKGROUND OF THE INVENTION

The basic DRAM memory technology prevalent in semiconductor applications operates so as to allow immediate write or rewrite of data into cells as soon as the data are valid on the bit lines. As memory chip density has increased, however, power and current density problems have become critical. Modifications to conventional DRAM operation have been proposed to reduce massive bit line charging currents associated with read/write cycles and refresh cycles. Masakaza Aoki et al. described one such technique in a paper in the IEEE Journal of Solid State Circuits, Vol. 24, No. 5, October 1989, pp 1206–1212, "A 1.5 V DRAM for Battery Based Applications." However, they indicate a severe memory cycle time penalty of 100 ns arising mostly from their write or rewrite operations. Another technique described in U.S. Pat. No. 5,414,656, "Low Charge Consumption Memory", issued to Kenney May 9, 1995, can avoid most of the 100 ns penalty, but will incur a similar write penalty if an attractive signal enhancing option is utilized. Since low current, high signal, and rapid write time are desirable attributes for memory products, a need exists for methods which provide all of them simultaneously.

SUMMARY OF THE INVENTION

An object of the present invention is to provide a technique whereby a preconditioning operation can be carried out on a memory storage element with a minimum impact on memory cycle time, or more particularly, memory write time.

U.S. Pat. No. 5,414,656 utilizes a storage node precharge operation as preconditioning for a DRAM storage element, and is an example of a memory method which may be improved by the method of the present invention. Precharge occurs prior to writing data into a DRAM cell, and is done on an entire column. The time required for precharge is relatively small, but may be substantially increased if a voltage boosting operation is utilized to increase stored voltage.

In order to carry out the above object according to the present invention, a spare column of storage elements is provided which can be preconditioned, or precharged, during a time when it is not used for data storage. Later, during a write operation to a first memory address, the data are written into the preconditioned spare column of memory elements, without waiting to precondition a first column of memory elements associated with the first memory address. The first memory address is reassociated with the spare column of memory elements, and the first column becomes available for use as a new spare column. It is preconditioned during restore, standby and/or address time intervals so as to be ready to receive data designated for a second memory address during a subsequent memory cycle. In this way, most of the time involved with preconditioning, or precharge, is hidden, and does not contribute to memory cycle time. Cycle time delays arising in typical circuits employed by the present invention are small compared to the 100 ns delay reported by Aoki et al.

In a second embodiment, more than one spare column of memory elements is provided. One spare column is utilized for data storage during each memory cycle requiring a data write operation. Preconditioning time for each individual spare column can then be extended over as many memory cycles as there are spare columns. Thus, a relatively slow preconditioning operation, extending over multiple memory cycles, can be carried out with little impact on memory cycle time.

The technique of the present invention is also applicable to other memory systems, such as floating gate devices, that require erasure of previous data (i.e. preconditioning) prior to a data write operation.

BRIEF DESCRIPTION OF THE DRAWINGS

FIG. 6 shows an illustrative example of the changing content of a cache memory during operation according to the present invention.

REFERENCE NUMERALS IN THE DRAWINGS

21 Memory array having $2^N$ columns.
22 A row of column driver circuits serving $2^N$ columns.
23 A column decode matrix for $2^N$ columns.
24 A symbolic number of conventional electrical connecting lines.
25 A symbolic number of memory address input terminals to matrix 23.
31 Memory array having at least one spare column.
32 A row of column driver circuits servicing 31.
33 A column decode matrix servicing 31.
35 A cache memory having $2^N$ columns.
36 An address gate.
37 A selected address latch.
38 An address gate.
39 A spare address latch.
40 An address gate.
41 A row of write select circuits servicing 31.
132 CMOS driver for a DRAM read/write word line.
232 CMOS driver for a precharge word line servicing the same column as 132.
L1–L12 Control signal lines.
N1–N6 Electrical nodes of a write select circuit.

DETAILED DESCRIPTION OF THE PREFERRED EMBODIMENTS

Figure 1:
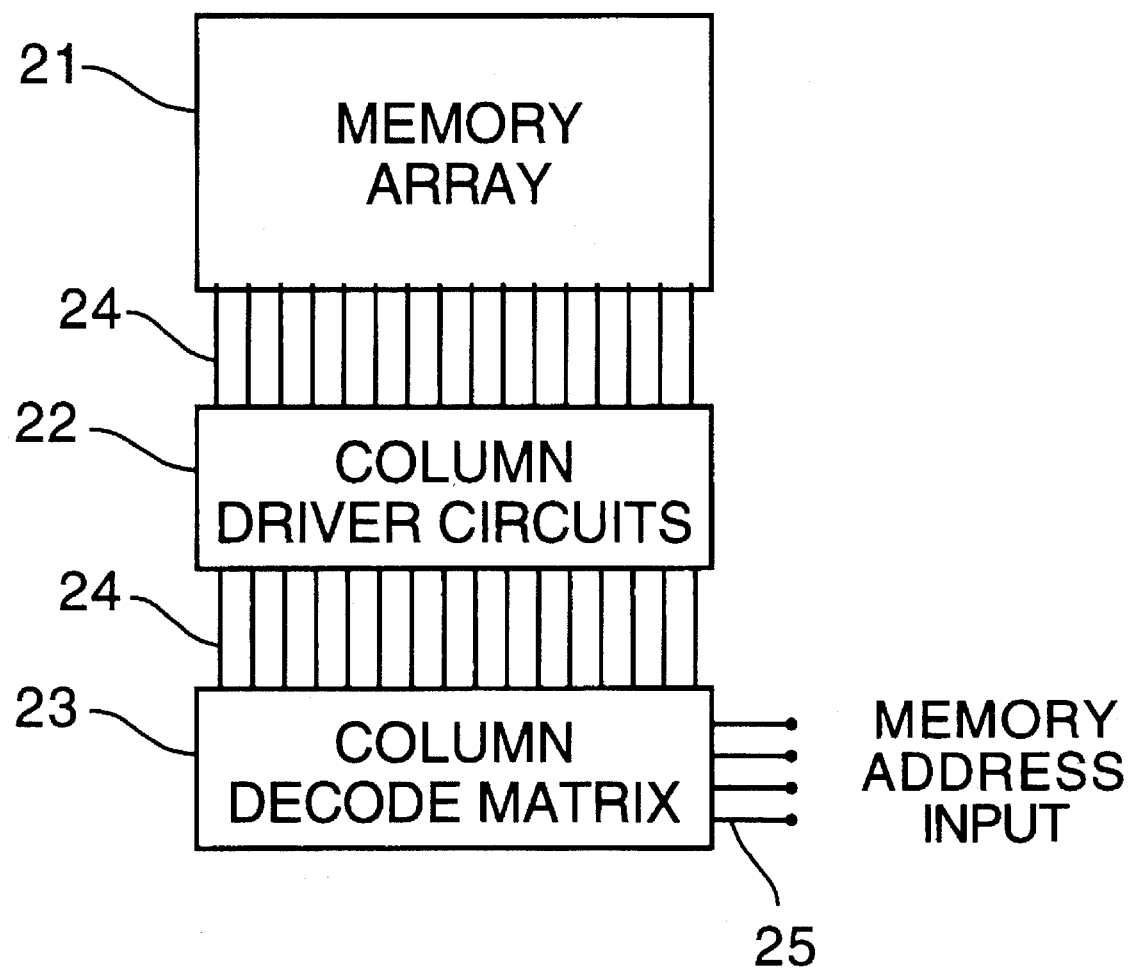
FIG. 1 is a conventional prior art memory in block diagram form.

FIG. 1 shows a typical prior art example, in block diagram form, of an addressable array of memory elements 21 arranged in rows and columns, a row of column driver circuits 22, a column decode matrix 23, and conventional electrical connections between them 24. The number of lines 24 shown is only symbolic, and is not necessarily a number that would actually be employed. Memory address input terminals 25 are also symbolic in the number illustrated. The memory address at terminals 25 is normally supplied in true/compliment form.

Usually the number of columns of memory elements in array 21 is equal to $2^N$, where N is an integer, and the column decode matrix 23 is capable of decoding one memory address out of $2^N$. Thus, any single column of memory elements in the array can be selected. In a conventional DRAM memory, the columns contain word lines running vertically in the Figure, and rows contain bit lines running horizontally in the Figure. Other conventional functional blocks for servicing the horizontal row dimension of the memory are not illustrated, as they are not necessary to a discussion of the present invention.

Also typical in prior art, but not shown, is the use of spare rows and/or columns of memory elements as redundancy to repair defective rows or columns of the array. Usually spares are utilized in such a way as to permanently substitute for, or replace, specific defective rows and columns. The defective rows and columns thus replaced are not subsequently addressable, and are not used to store information. Those skilled in the art will understand the particular means and circuits described below to illustrate the present invention are compatible with at least one conventional redundancy technique (see "Circuit Implementation of Fusible Redundant Addresses on RAMs for Productivity Enhancement" by B. Fitzgerald and E. Thoma, IBM J. of Res. and Dev., Vol. 24, No. 3, May 1980, pp. 291–298). They will also recognize modified means or circuits can be used, as required, without departing from the spirit and scope of the present invention. For example, the present invention can similarly be applied to an array of redundant elements, or to multiple memory arrays.

Some definition of address terms is needed at this point. The words "address," "memory address," and "column address" are used conventionally in this document to identify and access data in the memory. The term "physical address" is introduced to distinguish a special type of address used only within circuits implementing the present invention. Physical addresses are stored, transmitted, decoded etc. by conventional address processing circuitry. Three different terms for particular physical addresses will be used frequently. These are "selected address", "spare address", and "unselected address". Meanings of the terms will become fully apparent later.

Figure 2:
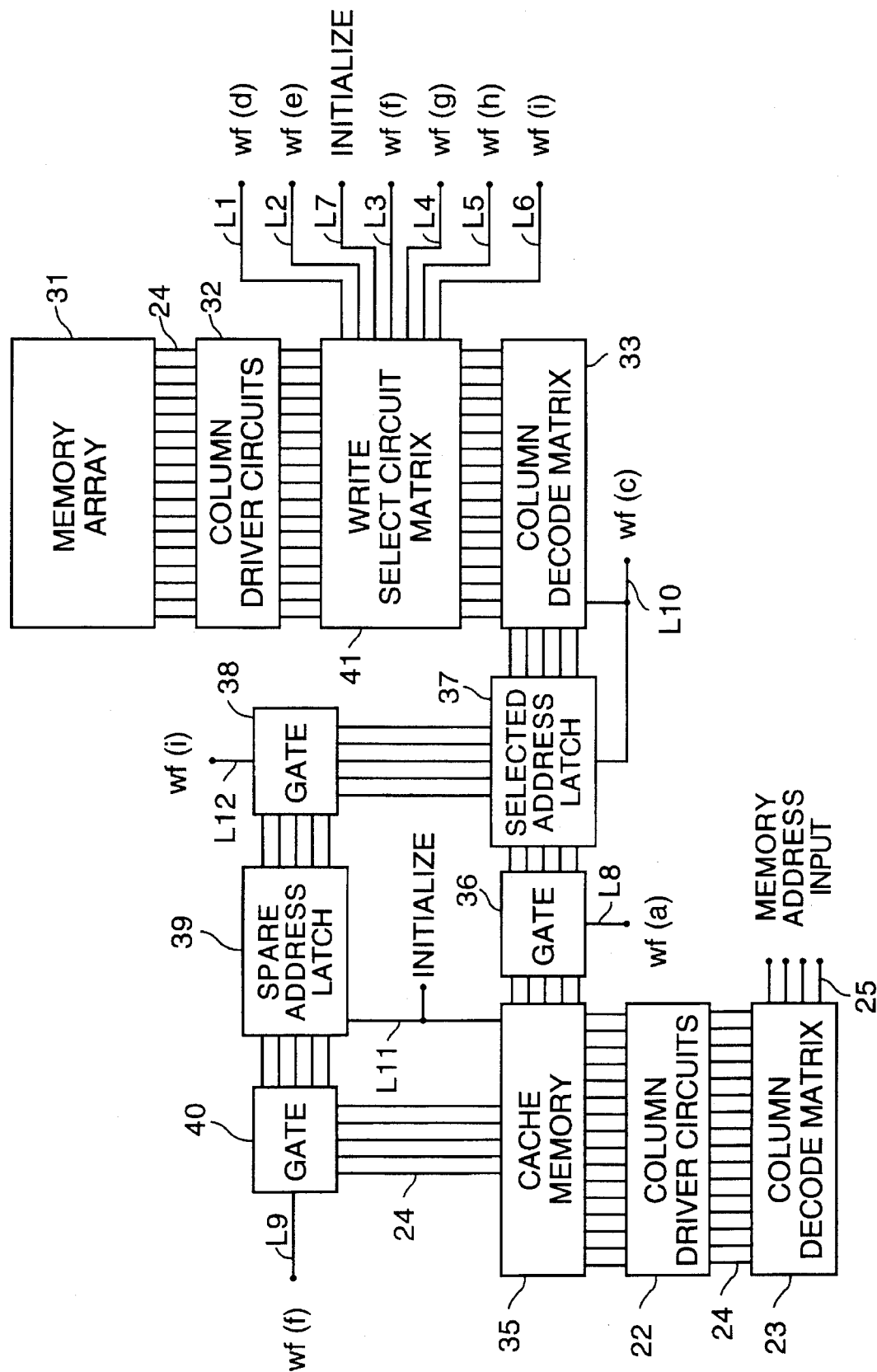
FIG. 2 is the present invention in block diagram form.

Analogous to FIG. 1, FIG. 2 shows the present invention in block diagram form. An addressable array of memory elements 31, is arranged in rows and columns, and has one more column than conventional array 21, i.e. $2^N+1$ columns. The additional column provides a spare column, and is not intended to increase the total number of bits which can be stored in array 31 above that which can be stored in the conventional array 21. Each column of array 31 is identified by a unique physical address associated with it, and any column can serve as the spare column. The identity of the spare column changes each time data are written into array 31.

As in FIG. 1, FIG. 2 has a row of column driver circuits 22, and a column decode matrix 23, each capable of servicing $2^N$ columns. Connected between column driver circuits 22 and array 31 in FIG. 2 are additional circuits designed to make use of the spare column according to the present invention. Collectively these circuits are referred to as a transfer means. The additional circuits include a cache memory 35 preferably of the static RAM type having a capacity sufficient to store $2^N$ physical addresses, a gate 40 capable of gating a single physical address from a spare address latch 39 into cache 35, a gate 38 capable of gating a single physical address from a selected address latch 37 into spare address latch 39, a gate 36 capable of gating a selected address from cache 35 into selected address latch 37, a column decode matrix 33 capable of decoding one physical address out of $2^N+1$ physical addresses, a matrix of write select circuits 41 having $2^N+1$ write select circuits, and a row of column driver circuits 32 for servicing $2^N+1$ columns. As in FIG. 1, a symbolic number of conventional electrical lines 24 connect the various blocks, and a symbolic number of memory address input terminals 25 are illustrated. Additionally, control signal lines L1 thru L12 connect to various functional blocks as illustrated.

Figure 3:
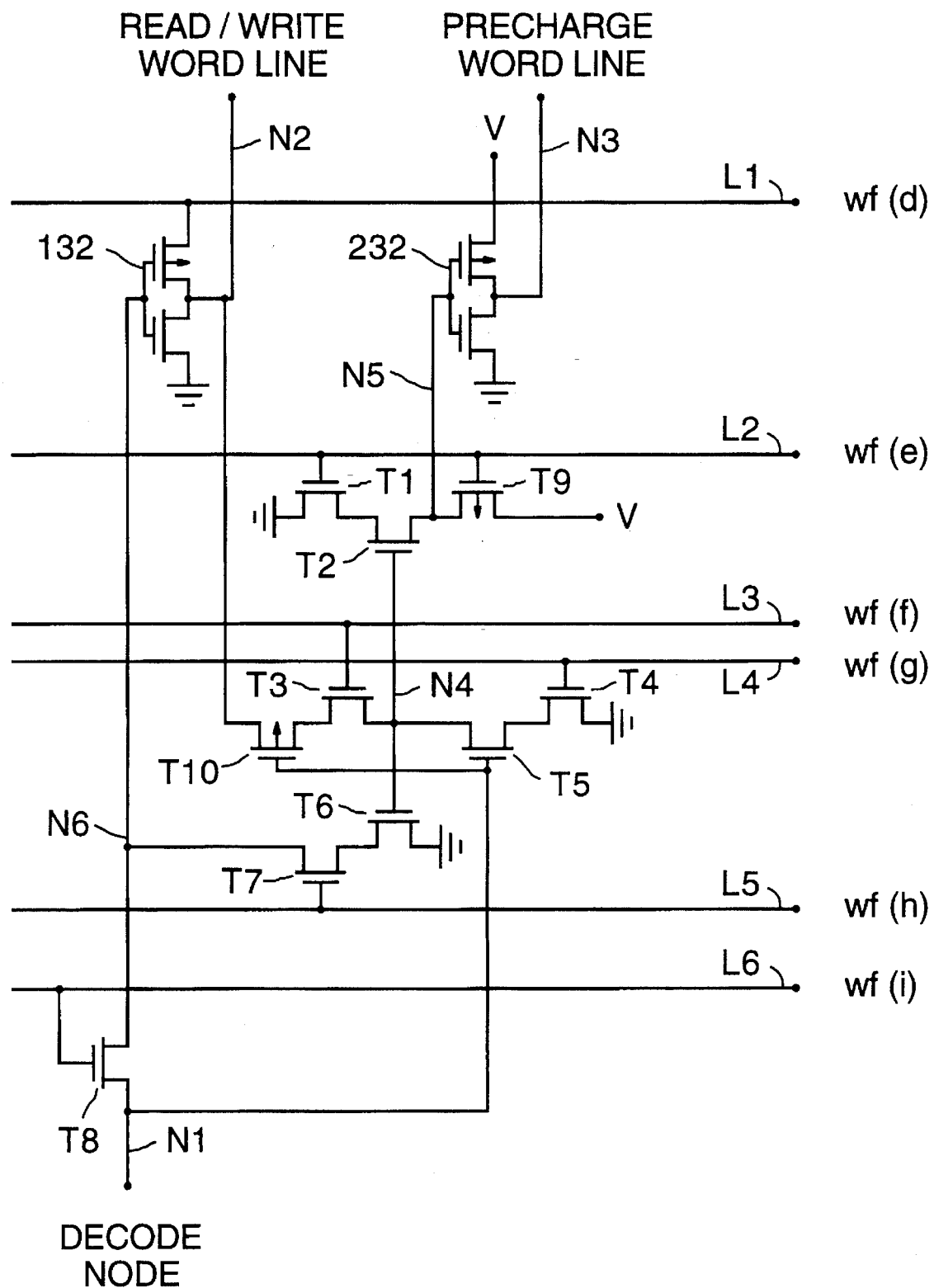
FIG. 3 is a basic write select circuit schematic.
Figure 4:
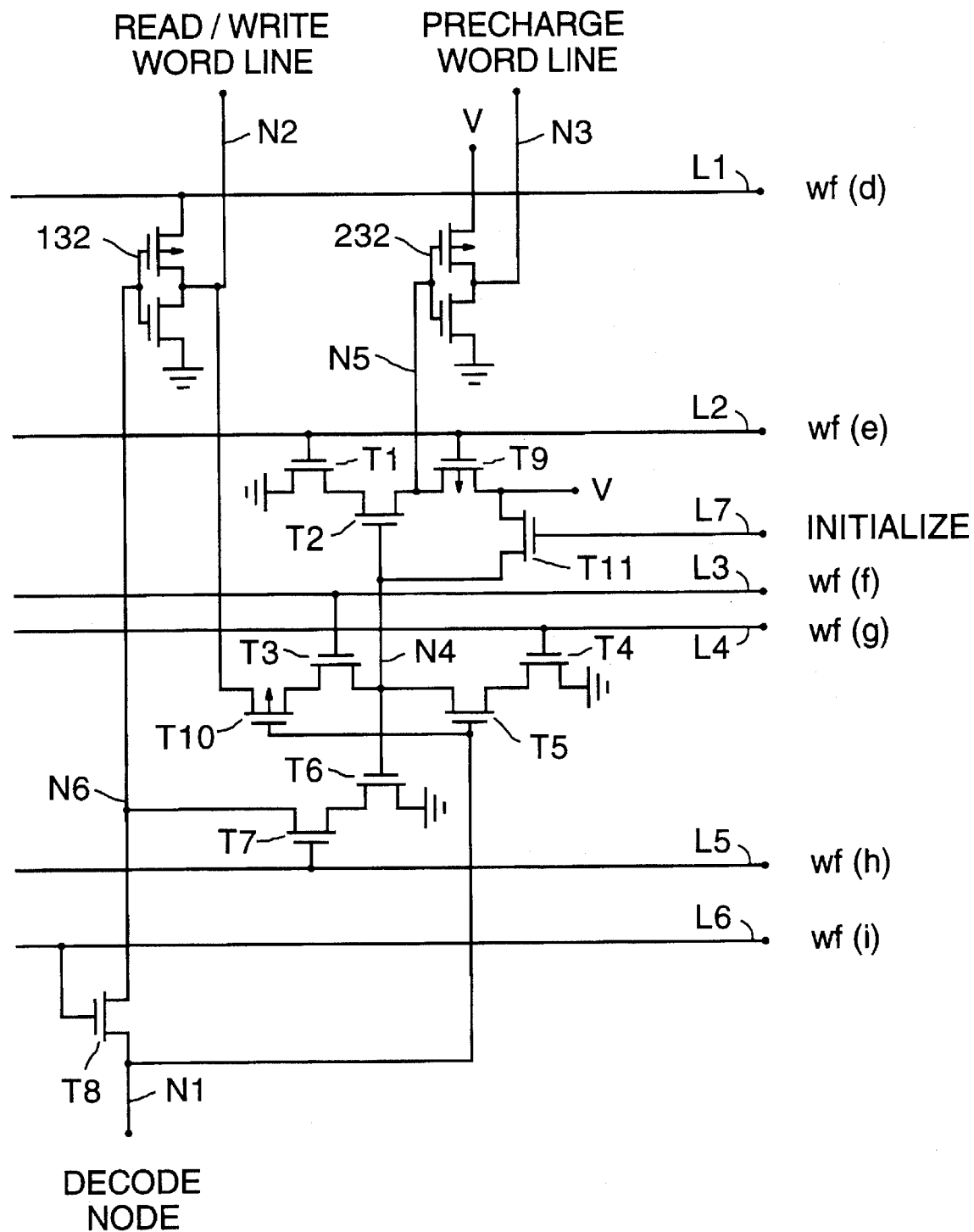
FIG. 4 is a modified write select circuit schematic.

All the symbolic functional blocks of FIG. 2, except the write select circuit matrix 41, may consist of conventional known circuit designs that implement the conventional functions indicated by the block names. Matrix 41 will generally be unique, and must be tailored to the requirements of the particular array of memory elements it serves. A basic write select circuit diagram is presented in FIG. 3. A modified write select circuit diagram is presented in FIG. 4. For illustration of the present invention, write select circuits in FIGS. 3 and 4 are designed specifically for use with one embodiment of a memory array of the type in U.S. Pat. No. 5,414,656. That array has conventional DRAM storage elements arranged in columns which are precharged via storage node precharge circuits under the control of a separate precharge word line in each column. i.e. Each column has both a conventional DRAM read/write word line and a precharge word line. It is important to recognize that a different embodiment, or a memory array comprised of a different prechargeable memory element, such as a floating gate memory element, would generally require different circuit details. Those skilled in the art will understand such differences may be utilized without departing from the spirit and scope of the present invention. The write select circuit matrix 41 of FIG. 2 comprises $2^N$ of the basic write select circuits shown in FIG. 3, plus one modified write select circuit shown in Figure 4. The total of $2^N+1$ write select circuits service the corresponding $2^N+1$ columns of memory array 31, and are each driven by a corresponding node of decode 33. For clarity, FIGS. 3 and 4 include conventional CMOS column driver circuits 132 and 232 that comprise the row of column driver circuits 32 shown in FIG. 2. Connecting nodes N2 for a DRAM read/write word line, and N3 for a precharge word line, are indicated. Node N1 is for connection to the corresponding individual column decode node in matrix 33, and receives the decoded output of 33. Of particular interest is node N4, which serves as a control bit capacitive storage node during operation of the present invention. While not illustrated in the figure, node N4 may include a separate capacitive storage element if necessary. Also identified are nodes N5 and N6 for reference below in the operating description. N-channel transistors T1 thru T8 and P-channel transistors T9 and T10 comprise the active components of a basic write select circuit. Control signal lines L 1 thru L 6 service all write select circuits in write select circuit matrix 41. In FIG. 4, transistor T11 and control line L7 comprise a modification of the basic write select circuit of FIG. 3. Control line L7 services only the modified circuit, and provides a means to initialize a high voltage level on node N4 of the modified circuit prior to normal operation of the memory according to the present invention.

WAVEFORMS

Figure 5A:
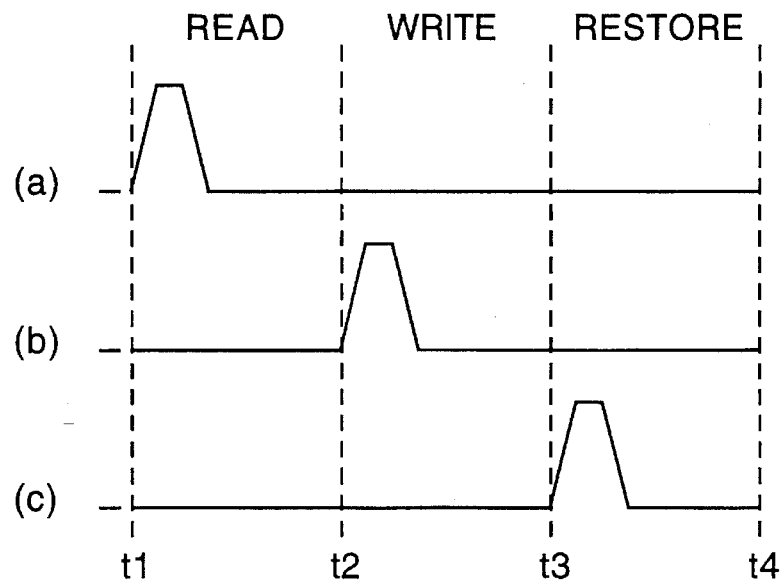
FIG. 5A shows basic memory timing waveforms.

A number of electrical timing waveforms and control signals are utilized for operation of the memory according to the present invention. Those skilled in the art will recognize variations or modifications could be used without departing from the spirit and scope of the invention. FIG. 5A shows three basic timing waveforms, (a), (b), and (c), for the overall memory operation, which define initiation of read, write, and restore time intervals respectively. Additional time intervals can be defined for various purposes of normal memory operation, but are not essential to discuss the present invention. Memory access cycles include read, write, and restore time intervals, plus any additional defined time intervals needed. The read time interval extends from time t1 to time t2, write extends from t2 to t3, and restore extends from t3 to t4. This is indicated in FIG. 5A by labels on the horizontal axis. These same three time intervals will be used for illustration of all electrical control signals and node voltages used to describe operation of the invention.

Figure 5E:
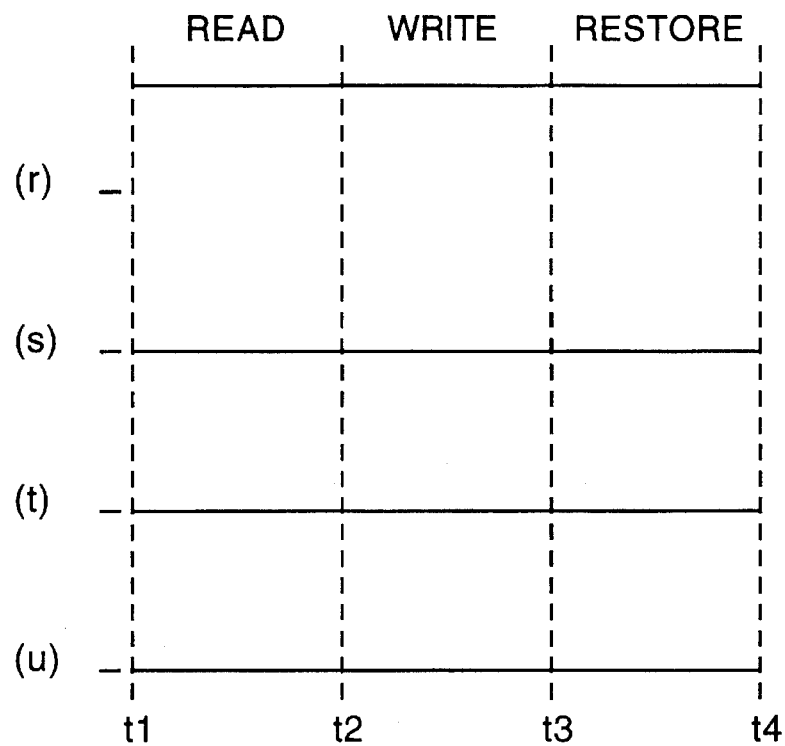
FIG. 5E shows waveforms on four nodes of a write select circuit at an unselected address.
Figure 5B:
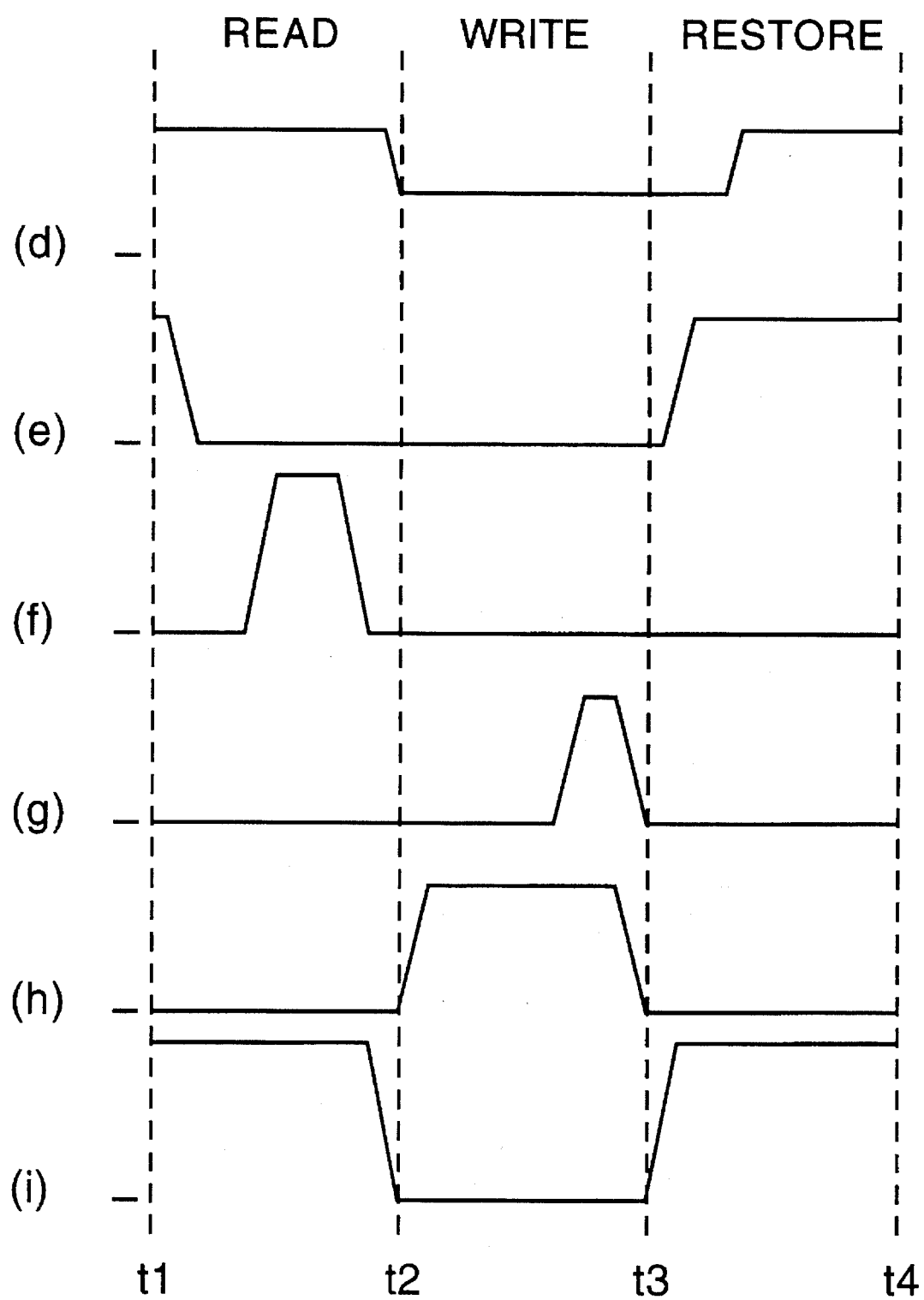
FIG. 5B shows six control waveforms for the present invention.

In FIG. 5B, control waveforms (d) thru (i) are illustrated. These six waveforms control operation of write select matrix 41 and are applied respectively to control lines L1 thru L6 as indicated in FIGS. 2, 3, and 4. All six waveforms are preferably derived from, or synchronized with, the basic timing waveforms (a), (b), and (c) of FIG. 5A.

Figure 5C:
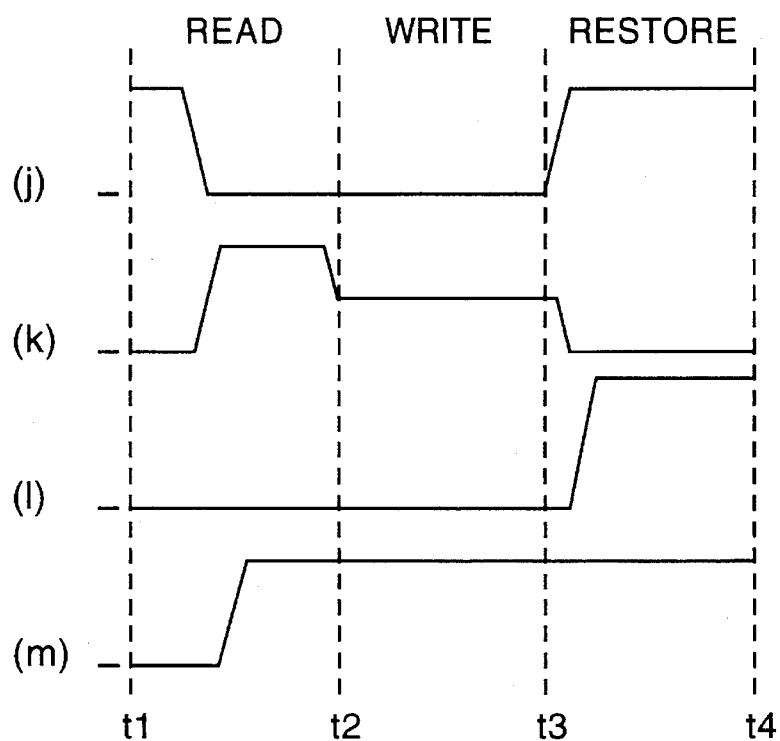
FIG. 5C shows waveforms on four nodes of a write select circuit at a selected address.
Figure 5D:
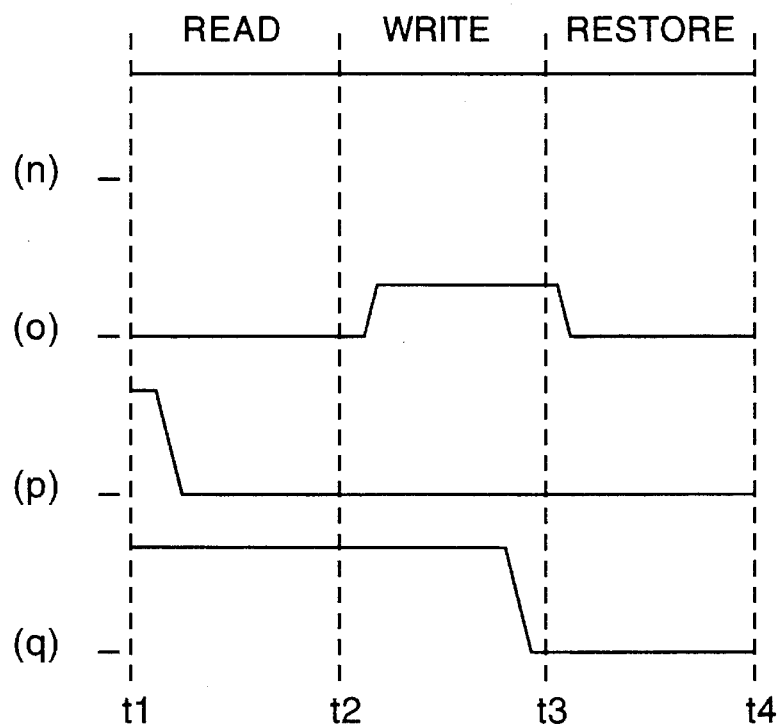
FIG. 5D shows waveforms on four nodes of a write select circuit at a spare address.

In order to understand operation according to the present invention, it is useful to simultaneously consider the waveforms on nodes N1 thru N4 at three different physical addresses. These are the selected address, the spare address, and an exemplary unselected address. It is necessary to keep in mind that these three terms refer to physical addresses, not to memory addresses. All unselected addresses behave in the same way. FIG. 5C waveforms (j) thru (m) occur on nodes N1 thru N4 at the selected address. FIG. 5D waveforms (n) thru (q) occur on nodes N1 thru N4 at the spare address. FIG. 5E waveforms (r) thru (u) occur on nodes N1 thru N4 of an unselected addresses.

For brevity and clarity throughout the following, the numerous waveforms may be referred to without use of a corresponding figure number, for example, FIG. 5B waveform (f) may be referred to simply as waveform (f), or even more briefly as wf (f). Similarly, control line L1 may be simply L1, and node N1 may be simply N1. There will be no confusion, since all reference identifications are unique even when abbreviated.

INITIALIZATION OF CIRCUITS

A simple initialization pulse (not illustrated) is used to set various voltage states into the functional circuits of the present invention prior to routine operation of the memory. The initialization pulse is not used during routine operation.

In FIG. 4 the initialization pulse on L7 causes a high voltage level to be written on node N4 of the modified write select circuit via transistor T11. This same initialization function is also indicated in FIG. 2 as an input on L7 to write select circuit matrix 41. L7 and T11 are not used after initialization. As will become clear later, a high N4 voltage temporarily identifies a write select circuit as serving the spare column of memory elements.

In FIG. 2 the initialization pulse on L11 causes initial physical addresses to be set into spare address latch 39 and cache 35. These physical addresses are identical to the $2^N+1$ physical addresses designed into decode 33. The particular initial physical address set into spare address latch 39 is labeled $A_s$, and is associated with the only modified write select circuit in matrix 41. Thus $A_s$ becomes the initial spare address. The other physical addresses of decode 33 are initialized in cache 35. Note none of the physical addresses designed into decode 33 need to be identical to the memory addresses designed into decode 23. However, they are assumed to be identical in an illustrative example presented later.

To complete initialization, waveform (e) is applied to control line L2 to discharge node N5 of the modified write select circuit in FIG. 4 to ground via T1 and T2. This causes precharge word line driver 232 to charge the initial spare column precharge word line via node N3, thus precharging the initial spare column of memory elements having physical address $A_s$ so that it is ready to receive data during the first routine memory cycle. N5 nodes of other write select circuits are not discharged by waveform (e) because their corresponding N4 nodes have not been charged, and their T2 transistors are consequently held off.

GENERAL OPERATION

After initialization the memory is ready for a first cycle of routine operation. Any one of $2^N$ memory addresses, for example address $A_{m1}$, is supplied to column decode matrix 23. This coincides with time t1 in FIGS. 5. Decode 23 activates the appropriate column driver circuit in 22, which in turn drives the $A_{m1}$ word line in cache 35. Physical address $A_i$ was initially associated with memory address $A_{m1}$ by being stored along the driven word line in cache 35, and is read out of the cache. It thus becomes the selected address, and is then gated (by waveform (a) on L8) via gate 36 into selected address latch 37, and immediately driven into column decode 33. The decoded output of 33 enters write select matrix 41, where a sequence of events controlled by waveforms (d) thru (i) of FIG. 5B activates the appropriate column driver circuits in 32. Details of the sequence within the circuits of 41 will be described later. The net result of the sequence is that accessing memory address $A_{m1}$ first causes read access to selected address $A_i$, and then causes write access to spare address $A_s$. Thus, data conventionally intended to be written at memory address $A_{m1}$, or data conventionally intended to be read and rewritten at $A_{m1}$, are instead written into the previously preconditioned spare column at spare address $A_s$. Spare address $A_s$, which was initialized in spare address latch 39, is then gated (by waveform (f) on L9) via gate 40 into cache 35 and written into the column of cache 35 where selected address $A_i$ was obtained at the beginning of the memory cycle. The spare address $A_s$ thus replaces $A_i$ in cache 35 as the physical address associated with memory address $A_{m1}$. Note, however, that $A_s$ will continue to be referred to as the spare address until the end of the memory cycle. Memory address $A_{m1}$, which was initially associated with the column having physical address $A_i$, can be thought of as having been reassociated with the column having physical address $A_s$. A subsequent memory read cycle directed to $A_{m1}$ will select the same column of cache 33, and utilize the physical address $A_s$ then located in that column, and obtain the appropriate DRAM data. Note physical address $A_i$ and its associated column in memory array 31 cannot be selected during the next memory cycle because $A_i$ will not be in the cache at the beginning of that access. In effect, memory elements at physical address $A_i$ have no associated memory address when $A_i$ is not in the cache memory. Shortly after spare address $A_s$ replaces $A_i$ in the cache, $A_i$ is gated (by negative going waveform (i) on L12) from selected address latch 37 into spare address latch 39 via gate 38, replacing the spare address previously stored there, and thus becoming a new spare address. Note, however, that $A_i$ will continue to be referred to as the selected address until the end of the memory cycle. Column $A_i$ is preconditioned during restore and prior to a second memory write operation, and will serve as the spare column during that write operation. i.e. It will receive the next column of data to be written. Preconditioning is controlled by write select circuit matrix 41 operations to be detailed later. During restore, waveform (c) on L 10 resets selected address latch 37 and decode 33 to standby condition so that they are ready for the next memory access.

Assuming the second routine memory cycle accesses a different memory address $A_{m2}$, then a different associated physical address $A_k$ is sent to selected address latch 37. Data conventionally intended to be written at memory address $A_{m2}$ are written in the preconditioned new spare column having physical address $A_i$ before any preconditioning of column $A_k$ takes place. Physical address $A_i$ is then gated into cache 35 from spare address latch 37, replacing $A_k$ in the appropriate column of 35. Next, address $A_k$ is gated into spare address latch 39 making column $A_k$ the new spare column, which begins preconditioning during the restore time interval t3 to t4. Physical address $A_k$ cannot be selected during the third memory cycle because it will not be in cache 35 at the beginning of that access. Physical address $A_i$ is again in cache 35 however, and can be selected during the third memory cycle.

The above general operating procedure is also utilized for refresh of the DRAM memory elements at regular periodicity as is normally required.

ILLUSTRATIVE EXAMPLE

FIG. 6 illustrates in tabular format an example of cache 35 physical address contents as initialized, and at the end of each of four memory cycles starting with the first cycle after initialization. A range of memory addresses from 001 thru 128 is assumed for the example and they appear in the first column of the Figure. The associated physical addresses initialized in the cache are in the second column of the Figure. The initial cache content shown is the same as the set of memory addresses, but could be a different set of 128 physical addresses provided they are designed into column decode 33. An initialized spare address of 129 is indicated at the bottom of the second column in FIG. 6, but a different appropriate physical address could be used provided it is different from all of the initial cache physical addresses, and identifies the initial spare column via the design of column decode 33. Cycle 1 in FIG. 6 is assumed to be a write access at memory address 003 as indicated in the CYCLE 1 heading. The set of physical addresses in cache 35 at the end of cycle 1 is listed under the CYCLE 1 heading in the third column of FIG. 6. Note initial spare address 129 has replaced initial physical address 003 in the cache at the end of cycle 1. Note also that physical address 003 has become the spare address at the end of cycle 1. This basic pattern of the previous spare address replacing the selected address in the cache by the end of each cycle, and the selected address becoming the new spare address by the end of each cycle, repeats thru the columns of FIG. 6. Cycle 4 illustrates a DRAM read/write operation, rather than a write operation like the first three cycles. At the beginning of Cycle 4, memory address 003 contains data in associated physical address 129 which were written during Cycle 1. Cycle 4 also illustrates how a memory address, in this case 003, is reassociated with a new physical address in the cache more than once, and how a previous spare address (129) can again become the spare address. In fact, the entire cache contents will usually change several times during the course of a large number of randomly addressed memory cycles, and also during simple refresh of the DRAM contents.

This completes description of the operation of the present invention in terms of the conventional functional blocks and circuits identified in FIG. 2.

WRITE SELECT CIRCUIT OPERATION

Now details of operation of unique write select matrix 41 in FIG. 2, deferred previously, will be described for a routine read/write memory cycle. First consider the write select circuit illustrated in FIG. 3 at the selected address. Later, write select circuits at the spare address and an unselected address will be considered for the same memory cycle.

SELECTED ADDRESS

At time t1 the read operation begins. For the selected address recall that FIG. 5C waveforms (j) thru (m) appear on nodes N1 thru N4 respectively.

During read the decoded output of 33, waveform (j), is applied to node N1 of FIG. 3 at the selected address.

Since waveform (i) on L6 is high during read, the low voltage on selected node N1 is passed to node N6 via T8. This causes word line driver 132 to charge the DRAM read/write word line at node N2 from waveform (d) on L1, which is high at that time. Node N2 and the attached read/write word line thus carry waveform (k). The charged word line causes data from the selected column to appear on the bit lines of the memory array. It is sensed and set on the bit lines in conventional DRAM fashion as prescribed in U.S. Pat. No. 5,414,656. According to 5,414,656 the binary data are set as two slightly different low voltage levels in order to reduce charging current. As indicated previously, the selected column becomes a new spare column for data storage during a subsequent memory cycle. In order for this to happen, the selected column is identified within matrix 41 as the next spare column. This is done by charging node N4 of the selected column to a high voltage level and temporarily retaining the charge as an identifying control bit. During the next memory cycle, the high voltage on N4 will cause the column to respond to control signals as a spare column. Node N4 is charged during read from waveform (k) on N2, via T10 and T3. Transistor T10 is turned on by decode output waveform (j) on N1. Transistor T3 is turned on by control waveform (f) on L3. The up level of waveform (f) may be boosted in order to store a full high voltage level on N4. No N4 nodes on unselected addresses in 41 are affected by control waveform (f), because all unselected N1 nodes, having decode output waveform (r), are held at high levels, keeping all unselected T10 transistors off.

At time t2 the read operation ends and the write operation begins. Data set on the bit lines during read, or new data set on the bit lines at this time, are available. Although the data are to be written into the column at the spare address, a spurious write activity occurs on the column at the selected address. The spurious write activity is the subject of this paragraph. The "real" write operation at the spare address is described later. At t2, control waveform (d) on L1 drops to an intermediate voltage level required on the write word line for a write operation of the particular type memory array used in this example. A different type of memory array would generally require a different voltage for a write operation. Also at t2, control waveform (h) on L5 clamps selected address node N6 to ground via T7 and T6. Node N6 at unselected addresses is not clamped to ground at this time because N4 nodes at unselected addresses are low, and corresponding T6 transistors are off. Low voltage on N6 drives the intermediate voltage level as waveform (k) on node N2, and the read/write word line, at the selected address. Therefore DRAM data levels on the array bit lines are written into cells along the selected address. However, these data are of low voltage level because the selected column has not been precharged, and will not be used. Identical DRAM data of full voltage level are simultaneously written in the spare column as described later. The unusable data levels written into the selected column are discussed here simply to provide a full understanding of activity within the array. At time t3 control waveform (h) on L5 goes to a low level, turning off T7. Immediately after, control waveform (i) on L6 and waveform (j) on N1 go high, recharging node N6 via T8. This causes driver 132 to clamp the read/write word line to ground shortly after t3, thus ending the spurious write operation.

At time t3 the restore time interval begins. Precharge of the selected column is initiated by control waveform (e) on L2 going to a high level. Node N5 at the selected address, which had been held high by waveform (e) via T9, is discharged to ground via T1 and T2. Node N5 at unselected addresses is not discharged at this time because N4 nodes at all unselected addresses are low, and corresponding T2 transistors are off. Low voltage at N5 causes the precharge word line at the selected address to charge via N3, thus starting precharge of the column of memory elements. Note this precharging erases the spurious data just written at the selected address. Also note precharging, or preconditioning, will continue until control waveform (e) returns to a low level, causing N5 to go high again. FIG. 5B indicates waveform (e) will preferably go low early in the next read time interval. This means precharge of the selected column, which is now identified in the spare address latch as the new spare column, will continue during standby and into the next memory cycle. Alternatively, waveform (e) could return low as soon as sufficient time for precharge has elapsed, and so it could return low during restore, or during standby, if precharge is complete at that time. Timing of preconditioning is a design decision, and can be tailored to the particular type of memory element being served.

This completes detailed operation of the write select circuit at the selected address.

SPARE ADDRESS

Next, write select circuit operation at the spare address is considered. For the spare address, recall that FIG. 5D waveforms (n) thru (q) appear on nodes N1 thru N4 respectively.

Return now to time t1 of the same memory cycle just considered above for the selected address. At the beginning of read, waveform (q) on node N4 at the spare address is at a high level, either because it was charged during initialization, or because it was charged during the previous memory cycle when it was the selected address. The spare column has also been precharged, either during initialization or during the previous memory cycle when it was the selected address. The precharge operation is ended at time t1 by control waveform (e) on L2 going to a low level, and charging N5 via T9, thus causing driver 232 to ground the precharge word line via N3. See waveform (p) on N3.

Since the spare column is not selected, the output of decode 33 connected to the spare column N1 node is at a high level. This is illustrated in FIG. 5D as waveform (n) on node N1. The high node N1 level is passed to N6 via T8 during read by control waveform (i) on L6, and holds the spare column read/write word line off during read. Thus, the precharged DRAM cells of the spare column are not disturbed by the read operation, and remain precharged. During read when control waveform (f) on L3 goes high, the spare column N4 node is not discharged via T3 and T10, because T10 is held off by decode waveform (n) on N1. Node N4 thus remains charged after the waveform (f) pulse ends.

At time t2 the write interval begins. Recall that according to the present invention, data conventionally intended to be written at the accessed memory address are written at the spare address instead, because the spare address column is already precharged and ready to receive data, while the selected address column is not. The procedure avoids a wait for precharge of the selected column. In order to do this, the spare column read/write word line, which was not driven during read, must be driven during write, so data on the bit lines will be written into the spare column of memory cells. At t2 control waveform (i) on L6 goes to a low level, shutting off T8. Shortly after, control waveform (h) on L5 goes to a high level, turning on T7, and causing spare column node N6 to discharge to ground via T6 and T7. The selected column N6 node is already at ground as described earlier, and remains at ground. All other unselected N6 nodes remain high because they have low levels on their N4 nodes, and their T6 transistors are off. Low voltage on spare column node N6 causes the spare column read/write word line to charge to an intermediate voltage level via driver 132 and control waveform (d). The intermediate voltage is high enough to cause precharged DRAM cells on low bit lines to discharge to low levels. The intermediate voltage is not high enough, however, to discharge DRAM cells on higher level bit lines, so they remain at high levels. Two slightly different low voltage data levels on the bit lines are thus stored as two greatly different voltage levels in the spare column DRAM cells. As mentioned earlier, the same data are simultaneously written into the selected column cells as two slightly different low voltage levels, which are subsequently erased by the precharge operation. Just before the end of the write time interval, control waveform (g) on L4 pulses to a high level, turning on T4 and discharging the spare column N4 node to ground via T4 and T5. The spare column T5 is held on by decode waveform (n) on its node N1. The selected column N4 node is not discharged because its T5 transistor is held off by decode waveform (j) on node N1. At the end of the write time control waveform (h) on L5 goes back to a low level turning off T7, and control waveform (i) on L6 goes high causing N6 to recharge to a high level from N1. This discharges the spare column read/write word line to ground via 132, completing the data write operation.

At time t3 restore begins. The restore operation does not affect data just stored in the spare column because its N4 node has just been discharged, and holds T2 off, causing the spare column to behave like all the unselected memory columns which also have low N4 nodes. Only the column at the selected address, which has a high N4 node, and is now the new spare column for the next memory cycle, is precharged during the restore operation as described previously.

This completes detailed operation of the write select circuit at the spare address.

UNSELECTED ADDRESSES

As indicated before, all unselected addresses behave in the same way. That is, they are not affected by a routine read/write operation, or any of the six control waveforms (d) thru (i). For an unselected address recall that FIG. 5E waveforms (r) thru (u) appear on nodes N1 thru N4 respectively.

The high level pulse of control waveform (f) on L3 cannot affect N4 via T3 and T10 because T10 is always held off by decode waveform (r) on N1. Control waveform (g) on L4 discharges node N4 to ground via T4 and T5.

At an unselected address the low level of control waveform (e) on L2 charges node N5, and thus clamps node N3 and the precharge word line to ground via driver 232. The high level of waveform (e) cannot discharge N5 to ground via T2 and T1 because T2 is always held off by the low level of waveform (u) on node N4.

The high level pulse of control waveform (h) on L5 cannot affect N6 via T7 and T6 because T6 is always held off by the low level of waveform (u) on node N4. The high level pulse of waveform (i) on L6 keeps node N6 charged to a high level via T8 and decode waveform (r) on node N1, this clamps the read/write word line to ground via driver 132. The high N6 node level also means that control waveform (d) on L1 cannot affect an unselected column.

This completes detailed operation of the write select circuit at an unselected address.

SECOND EMBODIMENT

The first embodiment of the present invention as described above utilizes one spare column of memory elements to obtain a cycle time improvement in memories that are preconditioned. However, some well known memory elements require relatively long preconditioning operations prior to receiving new data. Floating gate storage devices are an example. Erasure of a floating gate voltage level prior to writing new data may require microseconds or even milliseconds depending on the mechanism used. Further, a slow erasure may be unavoidable in order to maintain reliability of operation, because rapid erasure can actually be physically destructive or uncontrollable. While a single spare column can allow a preconditioning time comparable to a memory cycle time to be effectively hidden, longer preconditioning times are not fully masked.

The second embodiment of the present invention utilizes more than one spare column of memory elements to mask a long preconditioning operation. Similarly to the first embodiment, data are written into a preconditioned spare column without waiting for preconditioning of the selected column. Also similarly, the spare address replaces the selected address in a cache memory of physical addresses. The selected address is placed in a spare address latch, and the associated column begins preconditioning as a new spare column. A difference from the first embodiment is that the spare address latch contains multiple spare addresses. The latch is of conventional design, and holds the multiple spare addresses in a serial shift register fashion. One spare address is gated into the cache during each memory cycle. Generally, the gated spare address will have been preconditioned longer than other spare addresses. The other spare addresses remain in order in the serial spare address latch. The associated columns of memory elements continue preconditioning while the spare addresses reside in the latch. As a result, each spare column can be preconditioned during a plurality of memory cycles, a number of cycles equal to the number of spare columns.

In the first embodiment, one spare column is identified within the write select circuit matrix by one capacitive storage bit node. In the second embodiment, multiple spare columns are individually identified by multiple storage bit nodes. Using this identification, data written during each memory cycle are directed to the spare column associated with the spare address that is concurrently gated into the cache.

Because multiple spare columns and associated circuits require space approximately proportional to the number of spares, only a minimum necessary number of spares will generally be used. Thus, a design tradeoff between effective preconditioning, performance, and cost arises. Each application will generally have a unique optimum tradeoff among these design variables.

What is claimed is:

1. An array of memory elements, arranged in rows and columns having memory addresses, the improvement comprising:

(a) at least one spare column of said memory elements, and (b) transfer means for writing data directed to a first said memory address associated with a first said column, into a first said spare column during a memory access, and for reassociating said first memory address with said first spare column after beginning said memory access, and (c) means for operating said first column as a new spare column after said first memory address has been reassociated with said first spare column.

2. The array of claim 1 further including means for preconditioning said new spare column.

3. The array of claim 1 further including means for preconditioning said spare column during an initialization time prior to access of said array.

4. The array of claim 1 further including means for preconditioning said new spare column during a time when it has no associated memory address.

5. The array of claim 1 further including means for preconditioning said new spare column during more than one memory cycle.

6. The array of claim 1 further including means for preconditioning said new spare column during a time when it is not used for data storage.

7. An array of memory elements of a type that is preconditioned prior to writing of data, said memory elements arranged in rows and columns having memory addresses, the improvement comprising:

(a) at least one spare column of said memory elements, and (b) transfer means for writing data directed to a first said memory address associated with a first said column, into a first said spare column during a memory access, and for reassociating said first memory address with said first spare column after beginning said memory access, and (c) means for preconditioning said memory elements after writing data during said memory access and before writing data during a subsequent memory access.

8. The array of claim 7 further including means for preconditioning said spare column during an initialization time prior to access of said array.

9. The array of claim 7 further including means for preconditioning said first column during a time when it has no associated memory address.

10. The array of claim 7 further including means for preconditioning said first column during more than one memory cycle.

11. The array of claim 7 further including means for preconditioning said first column during a time when it is not used for data storage.

12. An array of memory elements of a type that is preconditioned prior to writing of data, said memory elements arranged in rows and columns having memory addresses, the improvement comprising:

(a) at least one spare column of said memory elements, and (b) transfer means for writing data directed to a first said memory address associated with a first said column, into a first said spare column during a memory access, and for reassociating said first memory address with said first spare column after beginning said memory access, and (c) means for preconditioning said first spare column longer than any other spare column.

13. The array of claim 12 further including means for preconditioning said spare column during an initialization time prior to access of said array.

14. The array of claim 12 further including means for preconditioning said first spare column during a time when it has no associated memory address.

15. The array of claim 12 further including means for preconditioning said first spare column during more than one memory cycle.

16. The array of claim 12 further including means for preconditioning said first spare column during a time when it is not used for data storage.

* * * * *